United States Patent
Tsukamoto (10) Patent No.: US 9,379,013 B1
(45) Date of Patent: Jun. 28, 2016

(54) METHOD FOR FORMING A SELF-ALIGNED CONTACT IN A DAMASCENE STRUCTURE USED TO FORM A MEMORY DEVICE

(71) Applicant: Sony Corporation, Tokyo (JP)

(72) Inventor: Masanori Tsukamoto, Boise, ID (US)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/560,865

(22) Filed: Dec. 4, 2014

(51) Int. Cl.
*H01L 21/00* (2006.01)
*H01L 21/768* (2006.01)
*H01L 45/00* (2006.01)
*H01L 27/108* (2006.01)
*H01L 21/02* (2006.01)
*H01L 21/311* (2006.01)

(52) U.S. Cl.
CPC ...... *H01L 21/76897* (2013.01); *H01L 21/0217* (2013.01); *H01L 21/02164* (2013.01); *H01L 21/02532* (2013.01); *H01L 21/02595* (2013.01); *H01L 21/31111* (2013.01); *H01L 21/76843* (2013.01); *H01L 21/76877* (2013.01); *H01L 27/1085* (2013.01); *H01L 27/10888* (2013.01); *H01L 45/14* (2013.01); *H01L 45/144* (2013.01); *H01L 45/146* (2013.01); *H01L 45/1608* (2013.01)

(58) Field of Classification Search
None
See application file for complete search history.

(56) References Cited

U.S. PATENT DOCUMENTS

| | | | | |
|---|---|---|---|---|
| 5,886,411 A | * | 3/1999 | Kohyama | H01L 21/76831 257/751 |
| 6,229,174 B1 | * | 5/2001 | Parekh | H01L 21/76843 257/306 |
| 6,329,255 B1 | * | 12/2001 | Gau | H01L 21/76885 257/E21.507 |
| 6,348,706 B1 | * | 2/2002 | Sandhu | H01L 21/02126 257/296 |
| 2006/0145229 A1 | * | 7/2006 | Kang | G03F 1/32 257/301 |
| 2013/0105873 A1 | * | 5/2013 | Kim | H01L 27/10852 257/296 |

* cited by examiner

*Primary Examiner* — Evren Seven
(74) *Attorney, Agent, or Firm* — Sheridan Ross P.C.

(57) ABSTRACT

Exemplary embodiments of the present invention are directed towards a method for fabricating a self-aligned contact under a bitline in a damascene structure for a memory device comprising forming a dummy pattern, forming dielectric sidewalls using a first dielectric film around the dummy pattern, forming a second dielectric film around the dielectric sidewalls, removing the dummy pattern forming a plurality of trenches, depositing active cell material in each of the plurality of trenches, forming a third dielectric film atop the active cell material; and creating a self-aligned contact hole using etch selectivity between the dielectric sidewalls and the second dielectric film.

17 Claims, 9 Drawing Sheets

METHOD FOR FORMING A SELF-ALIGNED CONTACT IN A DAMASCENE STRUCTURE USED TO FORM A MEMORY DEVICE

FIELD

Certain embodiments of the disclosure relate to a method for forming a self-aligned contact in a damascene structure used to form a memory device.

BACKGROUND

Increasingly, resistive RAM (ReRAM) devices and dynamic RAM (DRAM) devices are being used in mobile devices such as mobile phones and tablets due to their reduced power consumption and straightforward fabrication. Each of these devices comprises a plurality of memory cells forming an array of memory to store data. Conventionally, the memory cells are formed using a combination of one transistor and either one resistor or one capacitor. Generally, this architecture is referred to as "1T1R" or "1T1C". In the 1T1R or 1T1C architecture, the resistor or capacitor is often formed under a bitline, where the bitline is used to sense, program and reset a memory cell. In some instances, the resistor or capacitor is formed over the bitline at the cost of reduced operational speed. Forming the resistance or capacitance under the bitline may however increase the size of memory cells because the bitline contact must be formed between the resistor or capacitor. To address this problem, self-aligned contact technology is widely used in minimizing the wiring space and locating the contact among the wiring itself. The self-aligned contact technology (generally used in forming R or C below the bitline) is generally used when forming memory from a subtract structure. However, forming the self-aligned contact via etching processes causes damage to side portions of the material used to form the memory structure.

The use of a damascene structure in forming a memory device allows manufacturers to avoid damage to the side portion of the material. However, the damascene structure makes it difficult to isolate the resistor or capacitor with respect to the bitline contact, thus making it difficult to form a self-aligned contact.

Therefore, there is a need in the art for a method of forming a self-aligned contact within a damascene structure and process in accordance with exemplary embodiments of the present invention.

SUMMARY

Methods of forming a self-aligned contact within a damascene structure are provided as set forth more completely in the claims.

These and other features and advantages of the present disclosure may be appreciated from a review of the following detailed description of the present disclosure, along with the accompanying figures in which like reference numerals refer to like parts throughout.

DETAILED DESCRIPTION

Certain implementations of the invention are directed towards a method for forming a self-aligned contact within a damascene structure used for a memory device. In one embodiment, a contact hole is formed in a damascene structure. The contact hole is then deposited with a conductive material. A Silicon Nitride (SiN) sidewall is formed by film deposition followed by an etching back of the SiN layer. Subsequently, a poly-silicon dummy pattern layer can be exhumed leaving gaps to be filled with active cell material. A SiN is deposited above the cell, and an oxide layer is deposited above the nitride layer. A photo resist layer is patterned by lithography to cover the surface besides the self-aligned contact area, followed by dry etching the contact area.

Due to the difference in etch rate between the SiN and the Silicon-Dioxide layer, the pair of neighboring SiN sidewalls each form a contact hole where a contact plug is formed by a deposition of a conductive material. Accordingly, a self-aligned contact is formed under a bitline in a damascene structure used for a memory device.

Figure 1:
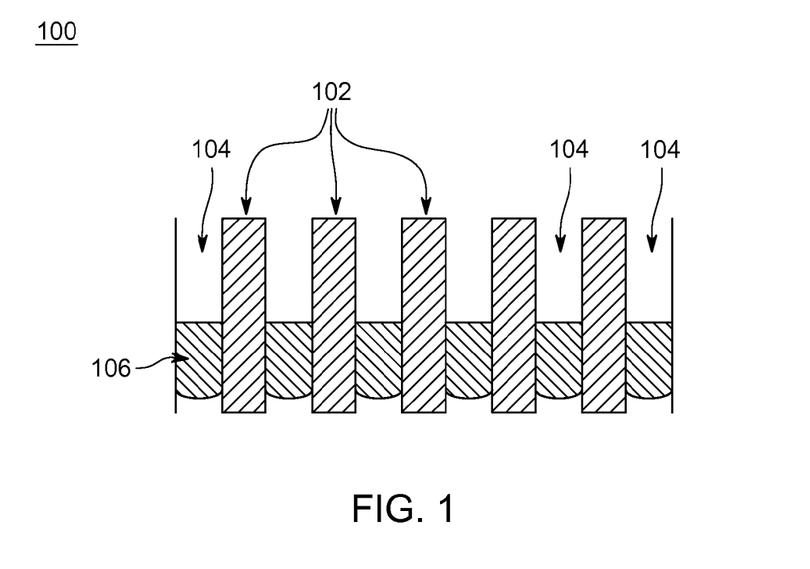
FIG. 1 depicts a first step in forming a self-aligned contact in a damascene structure in accordance with exemplary embodiments of the present invention.

FIG. 1 depicts a first step in forming a self-aligned contact in a damascene structure 100 in accordance with exemplary embodiments of the present invention.

The damascene structure 100 comprises isolation regions 102 formed between ion-implanted regions 106. Between each isolation region 102 are contact holes 104 where top electrodes will be deposited. According to one embodiment of the present invention, the isolation regions 102 may be a nitride material such as Silicon Nitride (SiN). According to the same embodiment, the ion-implanted region 106 is formed of Phosphorus so that the region 106 is an N+ type doped region. As an example, the diameter of contact holes 104 may be 20-30 nm, created using lithography and dry etching processes.

Figure 2:
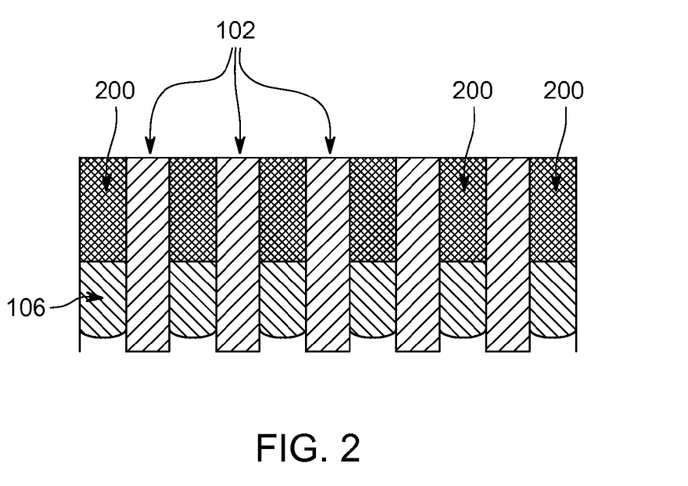
FIG. 2 depicts a second step in forming a self-aligned contact in a damascene structure in accordance with exemplary embodiments of the present invention.

FIG. 2 depicts a second step in forming a self-aligned contact in the damascene structure 100 in accordance with exemplary embodiments of the present invention.

A conductive layer 200 is deposited in each of the contact holes 104 using, in one embodiment, a physical vapor deposition (PVD) process. The conductive layer 200 is etched back using a dry etching process, or Chemical Mechanical Polish (CMP) process. According to one embodiment of the present invention, the conductive layer 200 is Titanium Nitride on Titanium, or in some embodiments, Tungsten (W on Ti/TiN). The deposition of the conductive layer 200 forms top electrodes for a source or a drain of a transistor which couples with a resistance or capacitance holding a memory bit.

FIG. 3(a) depicts a first part of a third step in forming a self-aligned contact in the damascene structure 100 in accordance with exemplary embodiments of the present invention.

Ploy-Silicon layer 300 is deposited by a chemical vapor deposition (CVD) process and then a photo resist is patterned by lithography to cover the surface besides the bitline contact area 304.

Figure 3:
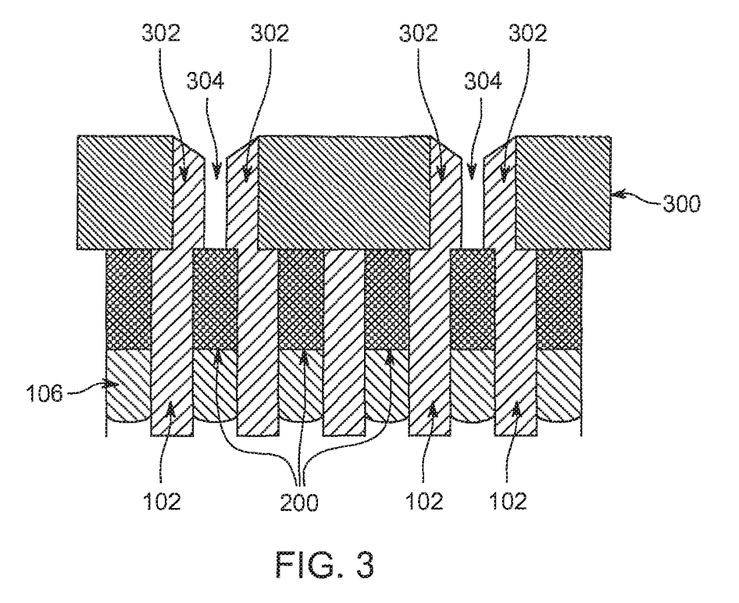
FIG. 3 depicts a third step in forming a self-aligned contact in a damascene structure in accordance with exemplary embodiments of the present invention.

FIG. 3 depicts a second part of the third step in forming a self-aligned contact in the damascene structure 100 in accordance with exemplary embodiments in the present invention. Poly-silicon in the bitline contact area 304 is removed using, in one embodiment, a dry etching process followed by removing the photo resist layer. A (Poly-Silicon) dummy pattern 300 is formed on the conductive layer 200 and the isolation regions 102 using, in one embodiment, chemical vapor deposition (CVD).

A dielectric material is deposited in the bitline contact area 304 using, in one embodiment, CVD. The dielectric material is etched back to form dielectric sidewalls 302. According to one embodiment of the present invention the dummy pattern 300 is made of poly-silicon. According to one embodiment of the present invention the dielectric material is Silicon Nitride.

Figure 4:
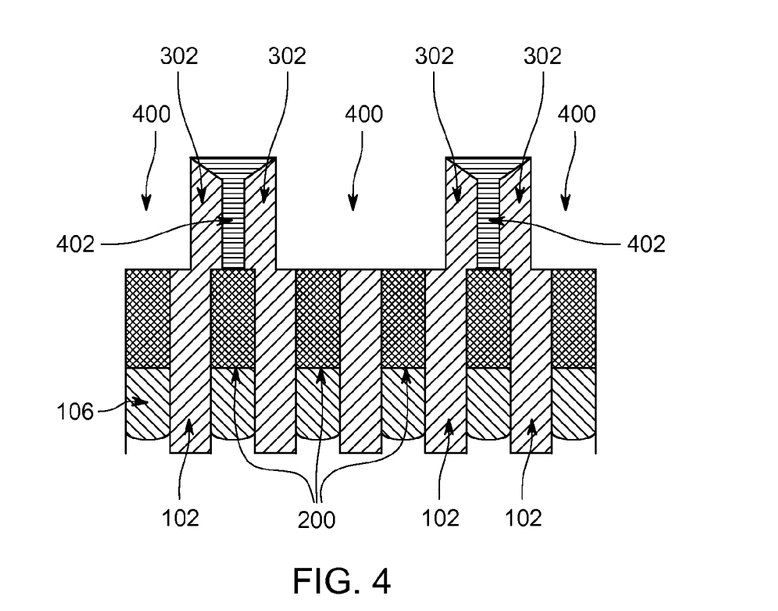
FIG. 4 depicts a fourth step in forming a self-aligned contact in a damascene structure in accordance with exemplary embodiments of the present invention.

FIG. 4 depicts a fourth step in forming a self-aligned contact in a damascene structure in accordance with exemplary embodiments of the present invention.

A second dielectric film 402 is deposited on the sidewalls and the dummy pattern 300 by, according to one embodiment, chemical vapor deposition. A CMP is performed to planarize the surface. The dummy pattern 300 in FIG. 3 is etched back leaving the dielectric sidewalls 302 with the second dielectric film 402 between, with trenches 400 in between neighboring dielectric sidewalls 302. According to one embodiment of the present invention, the second dielectric film 402 is silicon dioxide, or any material with a significantly greater etching rate than the dielectric sidewalls 302. Due to the higher etching selectivity between the dummy pattern 300 versus the sidewalls 302 and second dielectric film 402, the pattern 300 is etched back while the dielectric sidewalls 302 and second dielectric film 402 remain.

According to one embodiment, the poly-silicon is excluded using a chemical dry etch, or wet etching, though other methods may also be used.

Figure 5:
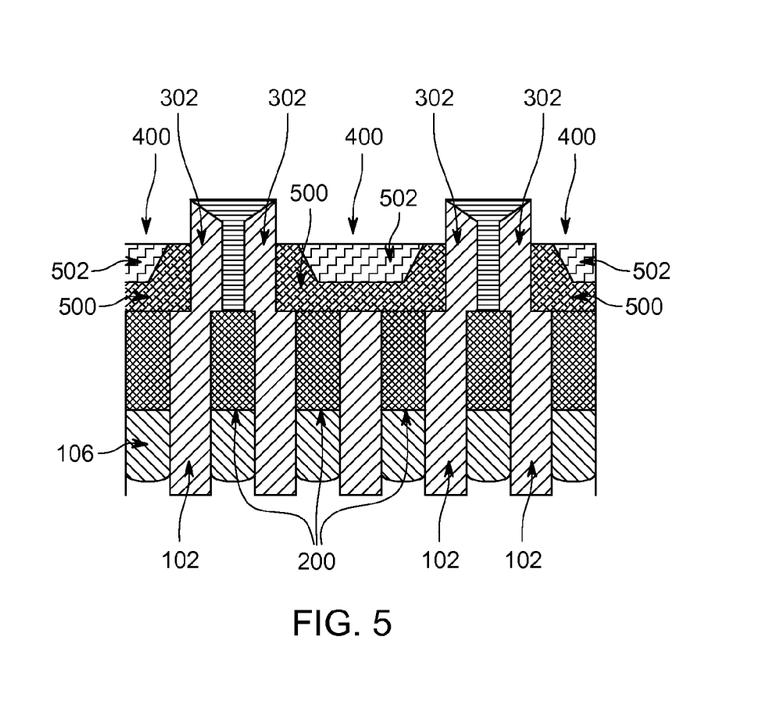
FIG. 5 depicts a fifth step in forming a self-aligned contact in a damascene structure in accordance with exemplary embodiments of the present invention.

FIG. 5 depicts a fifth step in forming a self-aligned contact in a damascene structure in accordance with exemplary embodiments of the present invention.

A pre-clean process, in one embodiment HF, is performed on each electrode 200. Active cell material 500 is deposited in each trench 400. In one embodiment, either PVD or CVD is used for deposition.

In some embodiments, the active cell material is a resistance material such as HfOx, TiOx, NiOx, AlOx or other oxide films. In this embodiment, the combination of Cu, Ag, Te and other transition metals may also be applied. In other embodiments, the active cell material 500 is a dielectric material to fabricate a capacitance for DRAM.

The active cell material 500 is etched back using, according to one embodiment, an isotropic etching to form a recess. A metal film 502 (Cu, Al, or W, for example) is deposited in the recess by a PVD process.

Figure 6:
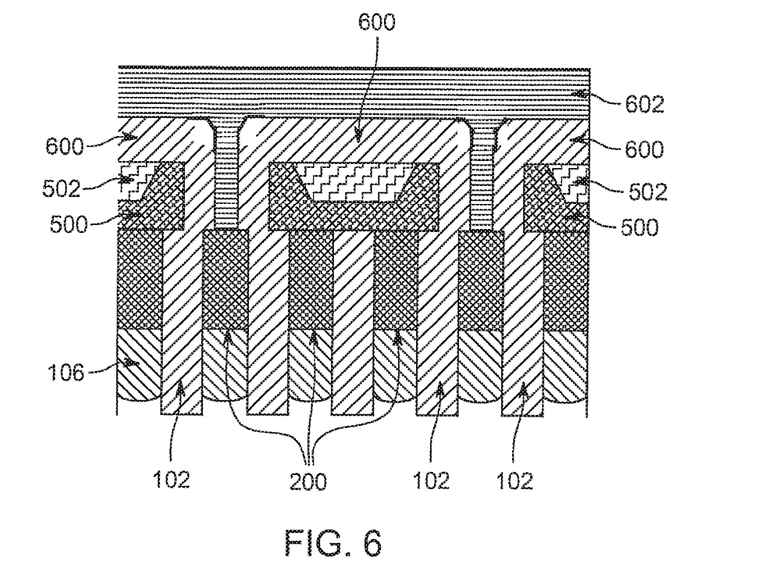
FIG. 6 depicts a sixth step in forming a self-aligned contact in a damascene structure in accordance with exemplary embodiments of the present invention.

FIG. 6 depicts a sixth step in forming a self-aligned contact in a damascene structure in accordance with exemplary embodiments of the present invention.

A third dielectric film 600 is deposited by, in one embodiment, a CVD process on top of the metal film 502 and the active cell material 500 between each pair of sidewalls 302. According to one embodiment of the present invention, the third dielectric film 600 is also Silicon Nitride. A CMP is performed on the third dielectric film 600 to planarize the surface.

A fourth dielectric film 602 is deposited on the third dielectric film 600 and in between neighboring dielectric sidewalls 302 above the conductive layer 200, using, in one embodiment, a CVD process. According to one embodiment, the fourth dielectric film 602 is also silicon dioxide (SiO2).

Figure 7A:
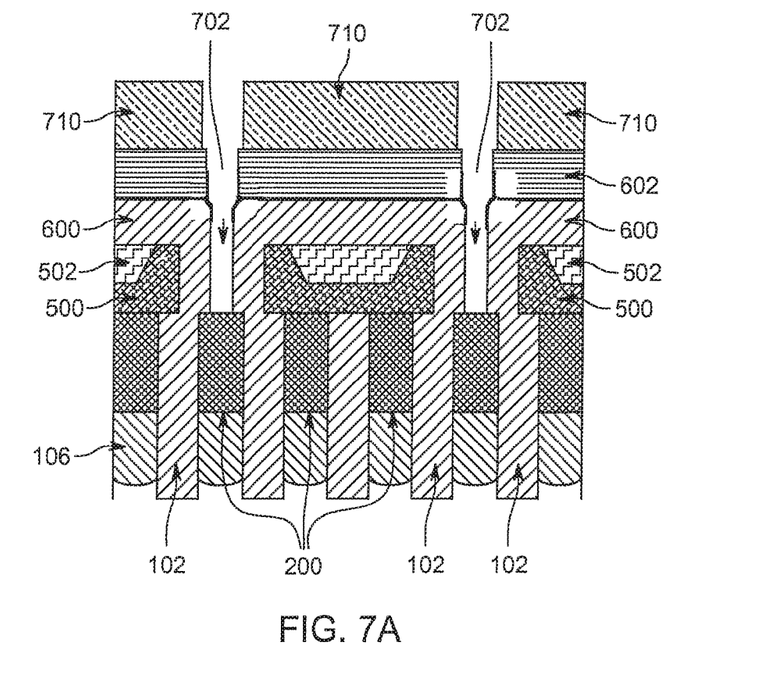
FIG. 7(a) depicts a seventh step in forming a self-aligned contact in a damascene structure in accordance with exemplary embodiments of the present invention.

FIG. 7(a) depicts a seventh step in forming a self-aligned contact in a damascene structure in accordance with exemplary embodiments of the present invention.

A photo resist layer 710 is patterned by lithography to cover the surface besides the self-aligned contact area 702 (bitline contact area). Thereafter the dielectric 602 and 402 between neighboring dielectric sidewalls 302 is removed using a dry etching process. SiN 302 is not removed due to high etching selectivity between SiN and SiO2.

Figure 7B:
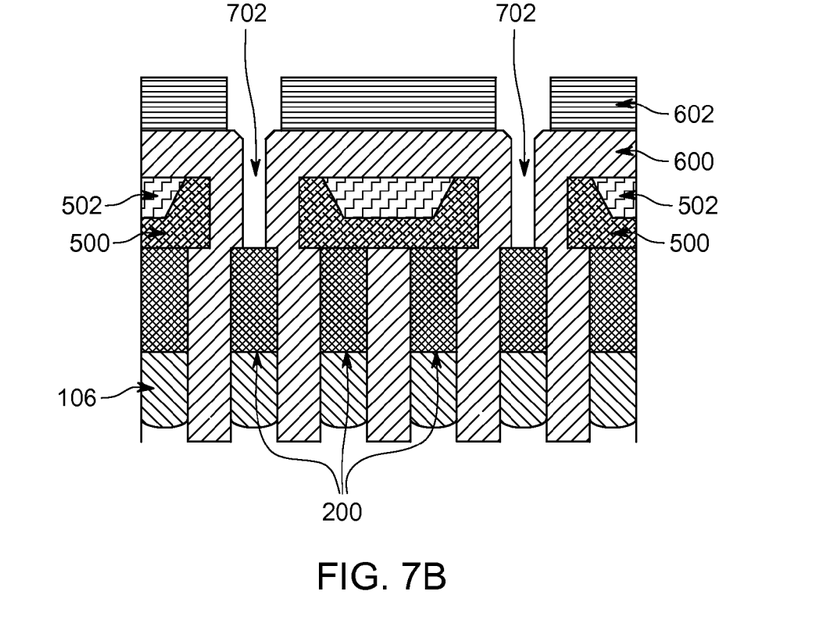
FIG. 7(b) depicts an eighth seventh step in forming a self-aligned contact in a damascene structure in accordance with exemplary embodiments of the present invention.

FIG. 7(b) depicts a seventh step in forming a self-aligned contact in a damascene structure in accordance with exemplary embodiments of the present invention.

Self-aligned contact holes 702 are created after removing the photo resist layer 710 due to the highly selective etching (e.g., 1:20) between SiO2 and SiN. The fourth dielectric layer 602 has an etch rate that is approximately twenty times faster than the etch rate of the third dielectric film 600, creating a larger hole in the fourth dielectric film 602 than the third dielectric film 600. Conformal film deposition followed by anisotropic etching on a cuboid structure results in the beveled shaped sidewalls seen in FIG. 7(b).

Figure 8:
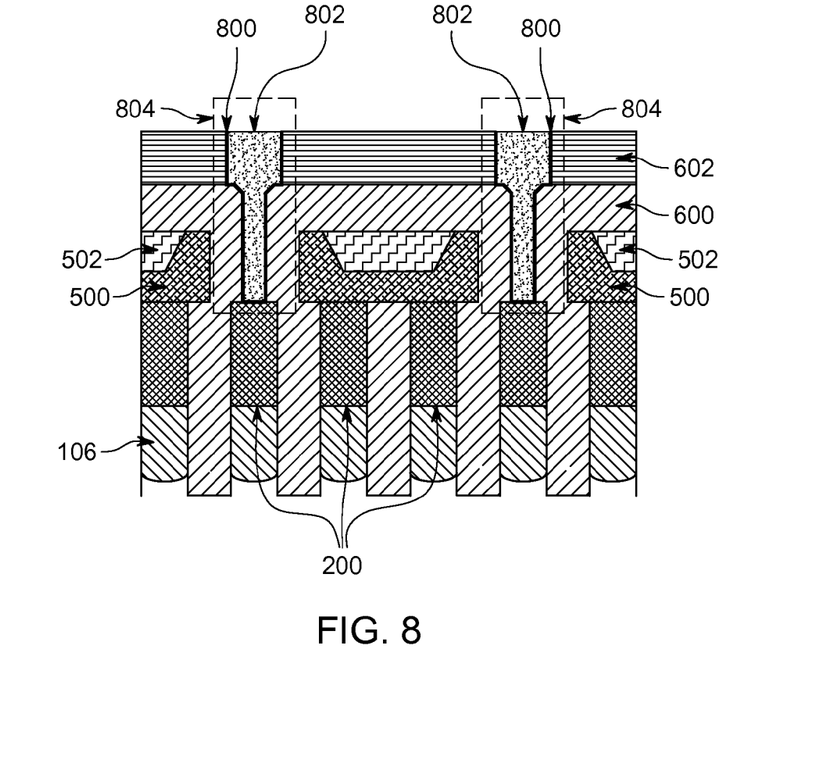
FIG. 8 depicts a ninth step in forming a self-aligned contact in a damascene structure in accordance with exemplary embodiments of the present invention.

FIG. 8 depicts a ninth step in forming a self-aligned contact in a damascene structure in accordance with exemplary embodiments of the present invention.

An insulator film 800 is deposited using PVD in each of the contact holes 702. According to one embodiment, the insulator film 800 comprises Titanium and then Titanium Nitride, but is not limited thereto. A conductive film 802 is then deposited on the insulator film 800 using CVD. According to one embodiment, the conductive film 802 comprises Tungsten (W) or the like. A chemical-mechanical planarization (CMP) is then performed to planarize the surface of the contact plug 804 formed by the insulator film 800 and the conductive film 802. Accordingly, self-aligned contacts are formed in a damascene structure without damaging the active cell material 500.

Figure 9:
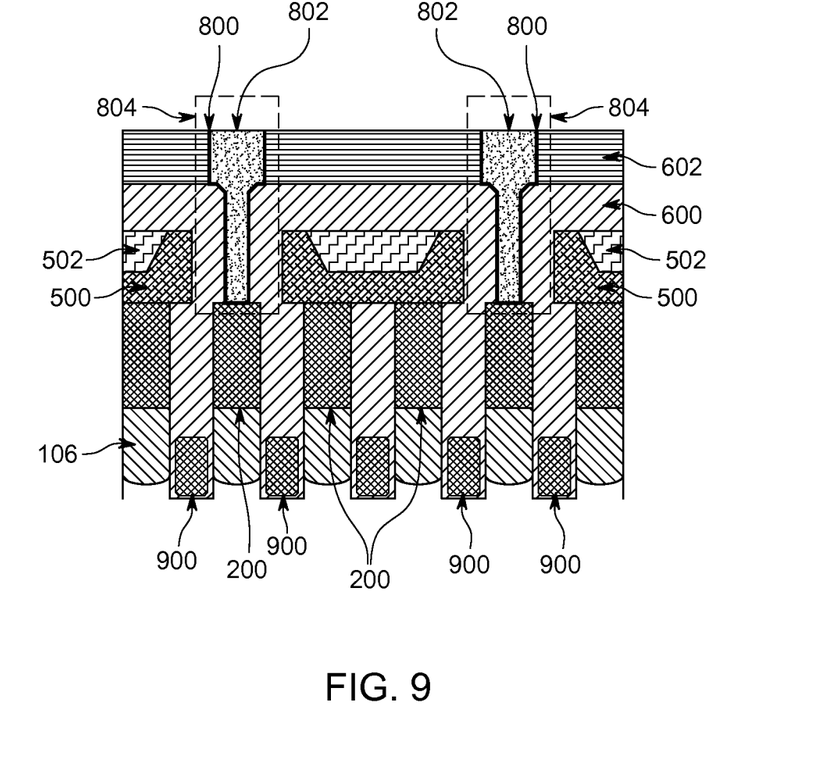
FIG. 9 depicts a tenth step in forming a self-aligned contact in a damascene structure in accordance with exemplary embodiments of the present invention.

FIG. 9 depicts a tenth step in forming a self-aligned contact in a damascene structure in accordance with exemplary embodiments of the present invention.

A bottom electrode 900 is implanted into each of the isolation regions 102. In one embodiment of the present invention, the bottom electrode 900 is formed of Titanium Nitride or Titanium.

Figure 10A:
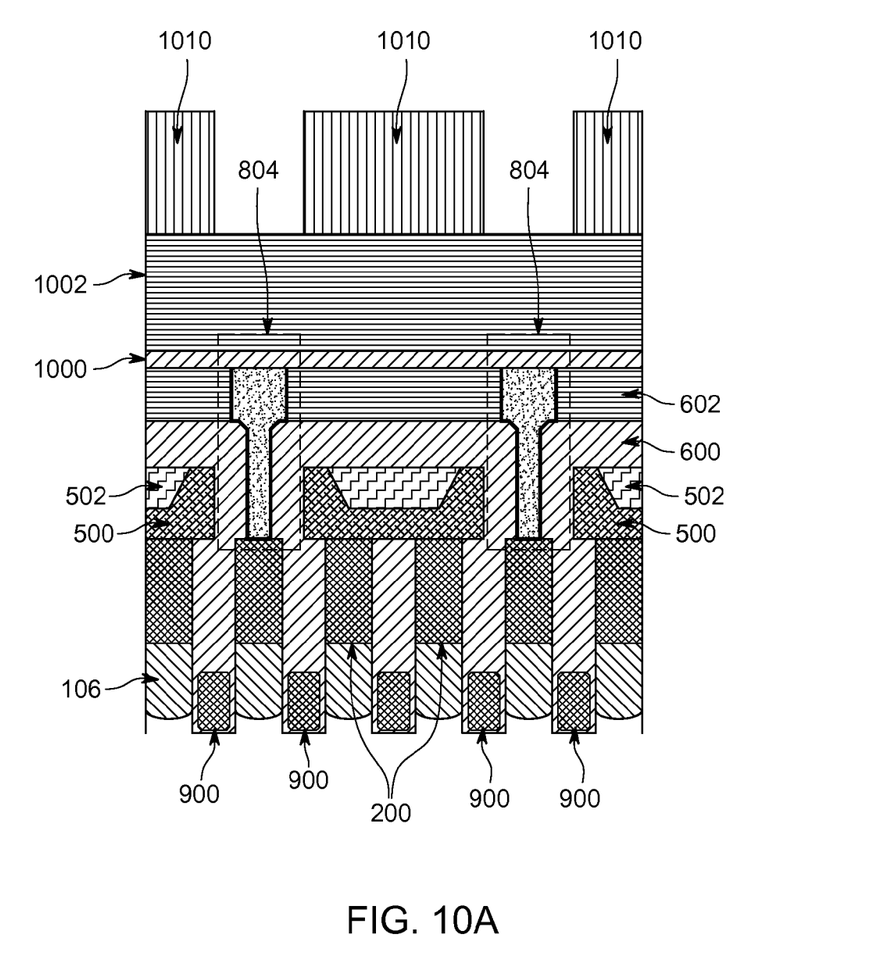
FIG. 10(a) depicts an eleventh step in forming a self-aligned contact in a damascene structure in accordance with exemplary embodiments of the present invention.

FIG. 10(a) depicts an eleventh step in forming a self-aligned contact in a damascene structure in accordance with exemplary embodiments of the present invention.

In this step, metallization is performed in the damascene structure. A fifth dielectric film 1000 is deposited on the fourth dielectric film 602 and above the contact plugs 804. In one embodiment of the present invention, the fifth dielectric film 1000 has a similar etching rate as the dielectric sidewalls and the third dielectric film 600 and the dielectric sidewalls 302. In this embodiment, the fifth dielectric film is also Silicon Nitride (SiN). A sixth dielectric film 1002 is deposited on the fifth dielectric film 1000. In one embodiment of the present invention, the sixth dielectric film 1002 has an etching rate similar to the fourth dielectric film 602. In this embodiment the sixth dielectric film 1002 is also Silicon Dioxide (SiO2). According to one embodiment, both films 1000 and 1002 are depositing using a CVD process.

Another photo resist layer 1010 is patterned by lithography to cover the surface besides the contact plugs 804.

Figure 10B:
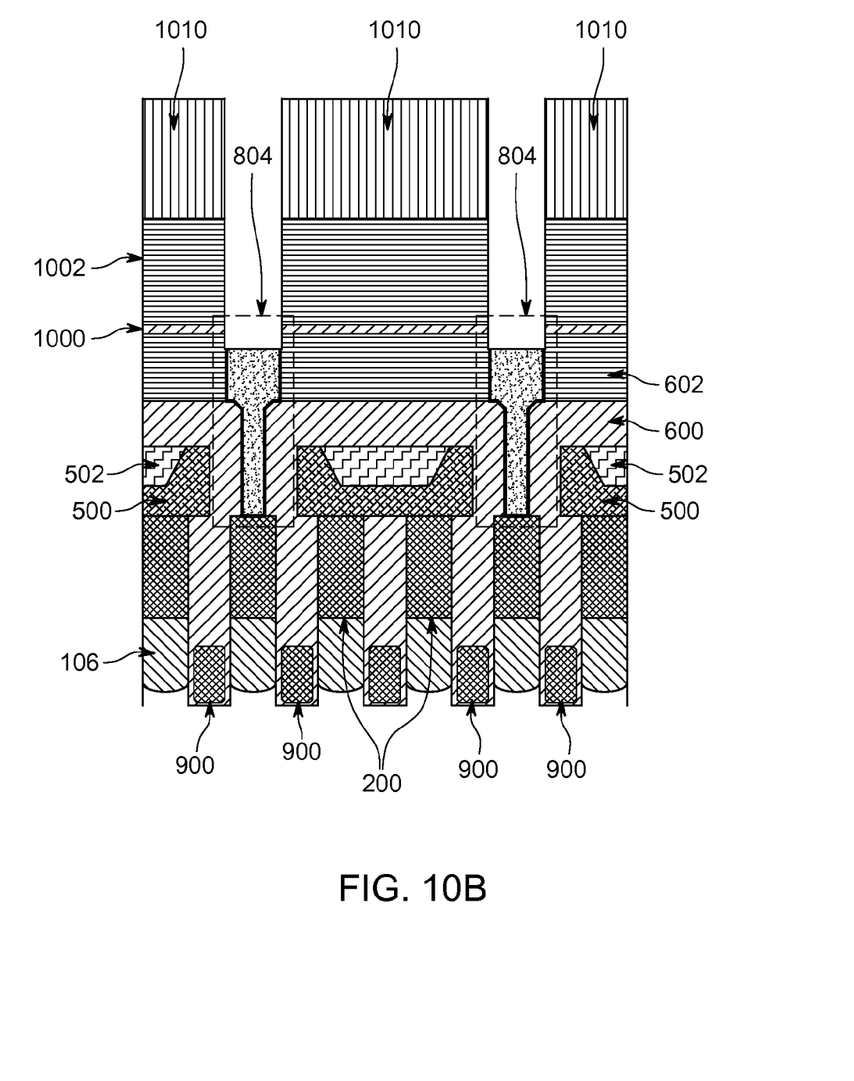
FIG. 10(b) depicts a twelfth step in forming a self-aligned contact in a damascene structure in accordance with exemplary embodiments of the present invention.

FIG. 10(b) depicts a twelfth step in forming a self-aligned contact in a damascene structure in accordance with exemplary embodiments of the present invention.

In this step, metallization is completed in the damascene structure. The sixth dielectric film 1002 and the fifth dielectric film 1000 are etched to form the bit trench areas 1020 using, in one embodiment, a dry etching process, above the contact plug 804.

Figure 11:
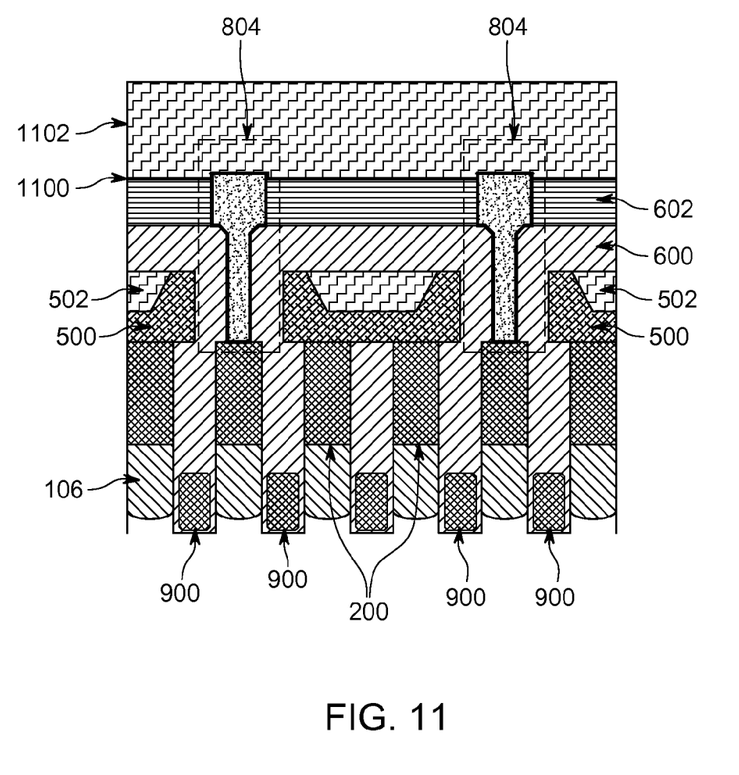
FIG. 11 depicts a thirteenth step in forming a self-aligned contact in a damascene structure in accordance with exemplary embodiments of the present invention.

FIG. 11 depicts a thirteenth step in forming a self-aligned contact in a damascene structure in accordance with exemplary embodiments of the present invention.

In this step, a conductive layer is formed above the trench areas. The photo resist layer 1010 is removed and a conductive layer 1100 is deposed on the fourth dielectric film 602 and above the contact plugs 804. According to exemplary embodiments, the conductive layer 1100 is composed of Titanium Nitride, Titanium, or the like. As a final step, a metal layer 1102 is deposited atop the conductive layer 1100. The metal layer 1102 forms a bitline for a memory device above the active cell material 500. In some embodiments, the metal layer 1102 is one of Cu, Al, or W and is deposited via a PVD process. A final CMP is performed to planarize the surface.

While the present disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

What is claimed is:

1. A method for fabricating a self-aligned contact in a damascene structure comprising:
   forming a dummy pattern;
   forming dielectric sidewalls using a first dielectric film around the dummy pattern;
   forming a second dielectric film on the dielectric sidewalls;
   removing the dummy pattern, thereby forming a plurality of first trenches;
   depositing active cell material and etching back to form active cells in each of the plurality of trenches;
   forming a third dielectric film atop the active cells;
   forming a fourth dielectric film atop the second and third dielectric films, wherein an etching rate of the first and third dielectric films is less than an etching rate of the second and fourth dielectric films; and
   creating a self-aligned contact hole by etching the second and forth dielectric films.

2. The method of claim 1 wherein the self-aligned contact hole is a bitline contact coupled to a bitline for a memory device.

3. The method of claim 2, wherein the bitline contact is deposited under the bitline.

4. The method of claim 2 wherein the dummy pattern is composed of polysilicon.

5. The method of claim 2, wherein the dielectric sidewalls and the third dielectric film are composed of Silicon Nitride.

6. The method of claim 1, wherein the second dielectric film and the fourth dielectric film are composed of Silicon dioxide.

7. The method of claim 1, wherein the etching rate of the second dielectric film is at least twenty times greater than the etching rate of the first dielectric film forming the dielectric sidewalls.

8. The method of claim 1, wherein the active cell material is a resistive material.

9. The method of claim 8, wherein the resistive material is one of HfOx, TiOx, NiOx, AlOx.

10. The method of claim 8, wherein the resistive material consists of Cu, Ag, Te and other transition metals.

11. The method of claim 1, wherein the active cell material is a capacitive material.

12. The method of claim 11, wherein the capacitive material is a dielectric material.

13. The method of claim 1, further comprising:
   patterning a photo resist layer on the third dielectric film; and
   removing the photo resist layer to create the self-aligned contact holes.

14. The method of claim 1, further comprising:
   depositing a photo resist layer on the fourth dielectric film, excluding a region above the self-aligned contact hole.

15. The method of claim 14, further comprising:
   removing the photo resist layer.

16. The method of claim 1, further comprising:
   depositing a conductive layer in the self-aligned contact hole; and
   depositing a metal layer above the conductive layer to form a self-aligned contact.

17. The method of claim 16, wherein depositing the conductive layer comprises:
   depositing a titanium film (Ti);
   depositing a titanium nitride (TiN) film; and
   depositing a tungsten film atop the TiN film.

* * * * *